(12) United States Patent
Cheng

(10) Patent No.: US 10,950,676 B2
(45) Date of Patent: Mar. 16, 2021

(54) ARRAY SUBSTRATE, DISPLAY PANEL AND DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 198 days.

(21) Appl. No.: 16/325,908

(22) PCT Filed: Aug. 2, 2018

(86) PCT No.: PCT/CN2018/098286
§ 371 (c)(1),
(2) Date: Feb. 15, 2019

(87) PCT Pub. No.: WO2019/052284
PCT Pub. Date: Mar. 21, 2019

(65) Prior Publication Data
US 2020/0357870 A1    Nov. 12, 2020

(30) Foreign Application Priority Data

Sep. 12, 2017    (CN) .......................... 201721170305.2

(51) Int. Cl.
*H01L 27/32*    (2006.01)
*H01L 27/12*    (2006.01)

(52) U.S. Cl.
CPC ...... *H01L 27/3258* (2013.01); *H01L 27/3248* (2013.01); *H01L 27/3262* (2013.01); *H01L 27/3246* (2013.01)

(58) Field of Classification Search
CPC ............. H01L 27/3262; H01L 27/3258; H01L 27/3248
See application file for complete search history.

(56) References Cited

U.S. PATENT DOCUMENTS

2003/0127657 A1* 7/2003 Park ..................... H01L 27/3246
                                                                257/79
2004/0075781 A1* 4/2004 Sohn ................. G02F 1/136286
                                                                349/43
(Continued)

FOREIGN PATENT DOCUMENTS

CN    102751311 A    10/2012
CN    207165572 U    3/2018
(Continued)

OTHER PUBLICATIONS

Examination report No. 1 for standard patent application, AU Application No. 2018331064, dated Jan. 20, 2020, 3 pp.
(Continued)

*Primary Examiner* — Zandra V Smith
*Assistant Examiner* — Jeremy J Joy
(74) *Attorney, Agent, or Firm* — Myers Bigel, P.A.

(57) ABSTRACT

An array substrate includes a base substrate including a plurality of pixel regions arranged in an array, a plurality of thin film transistors distributed within respective ones of the plurality of pixel regions, each of the thin film transistors including an active layer, a gate electrode, a source electrode and a drain electrode, the drain electrode including a first portion located in a second via, a passivation layer located on the source electrodes and the drain electrodes. The passivation layer is on the first portions of the drain electrode. A plurality of pixel electrodes are distributed within respective ones of the plurality of pixel regions and located on the passivation layer. Each of the pixel electrodes are electrically connected to a respective one of the drain electrodes through a respective third via that extends through the passivation layer.

18 Claims, 4 Drawing Sheets

(56) References Cited

U.S. PATENT DOCUMENTS

| | | | |
|---|---|---|---|
| 2005/0057460 A1* | 3/2005 | Lee | H01L 27/3248 345/76 |
| 2005/0116630 A1* | 6/2005 | Kim | H01L 21/76804 313/506 |
| 2006/0006540 A1* | 1/2006 | Park | H01L 27/3248 257/758 |
| 2006/0145161 A1* | 7/2006 | Lee | G02F 1/136227 257/72 |
| 2007/0002200 A1* | 1/2007 | Ashizawa | H01L 27/12 349/43 |
| 2007/0058099 A1* | 3/2007 | Eguchi | G02F 1/136227 349/43 |
| 2008/0164474 A1* | 7/2008 | Yamazaki | H01L 27/3276 257/59 |
| 2010/0025664 A1* | 2/2010 | Park | H01L 27/326 257/40 |
| 2011/0147757 A1* | 6/2011 | Kim | H01L 29/78633 257/71 |
| 2012/0235147 A1 | 9/2012 | Park et al. | |
| 2013/0285034 A1* | 10/2013 | Akamatsu | H05B 33/22 257/40 |
| 2014/0117323 A1* | 5/2014 | Ahn | H01L 27/1288 257/40 |
| 2014/0197413 A1* | 7/2014 | Liu | H01L 29/78678 257/59 |
| 2015/0108484 A1* | 4/2015 | Park | H01L 27/3248 257/71 |
| 2016/0141349 A1* | 5/2016 | Yun | H01L 27/3258 257/40 |
| 2017/0141172 A1* | 5/2017 | Cho | H01L 27/3246 |
| 2017/0194416 A1* | 7/2017 | Chen | H01L 51/5234 |

FOREIGN PATENT DOCUMENTS

| | | |
|---|---|---|
| JP | 2012-195283 A | 10/2012 |
| KR | 10-2005-0115705 A | 12/2005 |
| KR | 10-2014-0056565 A | 5/2014 |

OTHER PUBLICATIONS

Notification of Reason for Refusal and English language translation, KR Application No. 10-2019-7014155, dated Mar. 23, 2020, 10 pp.
International Search Report and Written Opinion of the International Searching Authority (with English language translation of Written Opinion), International Application No. PCT/CN2018/098286, dated Oct. 29, 2018, 12 pp.

* cited by examiner

ARRAY SUBSTRATE, DISPLAY PANEL AND DISPLAY DEVICE

CROSS-REFERENCE TO RELATED APPLICATIONS

The present application is a 35 U.S.C. 371 national stage application of PCT International Application No. PCT/CN2018/098286, filed on Aug. 2, 2018, which claims the benefit of Chinese Patent Application No. 201721170305.2 filed on Sep. 12, 2017, the contents of which are incorporated herein by reference in their entireties.

TECHNICAL FIELD

The present disclosure relates to the field of display technologies, and in particular, to an array substrate, a display panel, and a display device.

BACKGROUND

An array substrate generally includes a base substrate and a plurality of pixel units disposed on the base substrate and arranged in an array. Each of the pixel units includes a thin film transistor (TFT) and a pixel circuit electrically connected to the TFT.

The TFT generally includes an active layer, a drain electrode disposed above the active layer with respect to the base substrate, and an insulating layer between the active layer and the drain electrode. The drain electrode may be electrically connected to the active layer through a via in the insulating layer. In the case of a liquid crystal display, the pixel circuit includes a pixel electrode that forms one of the two electrodes of the liquid crystal capacitor. In the case of an organic light emitting diode (OLED) display, the pixel circuit also includes a pixel electrode (e.g., an anode electrode of an OLED device) on which a pixel defining layer is typically disposed. In either case, the pixel electrode can be electrically connected to the drain electrode of the TFT through the via.

SUMMARY

According to an aspect of the present disclosure, an array substrate is provided comprising: a base substrate comprising a plurality of pixel regions arranged in an array; a plurality of thin film transistors distributed within respective ones of the plurality of pixel regions, each of the thin film transistors comprising: an active layer located on the substrate; a gate electrode located on the base substrate, the active layer and the gate electrode being stacked on top of each other; a source electrode located above the gate electrode, the source electrode being electrically connected to the active layer through a first via; and a drain electrode located above the gate electrode, the drain electrode being electrically connected to the active layer through a second via, the drain electrode comprising a first portion located in the second via; a passivation layer located on the source electrodes and the drain electrodes, the passivation layer covering the first portions of the drain electrodes; and a plurality of pixel electrodes distributed within respective ones of the plurality of pixel regions and located on the passivation layer, each of the pixel electrodes being electrically connected to a respective one of the drain electrodes through a respective third via that extends through the passivation layer.

In some embodiments, the drain electrode further comprises a second portion outside the second via, and the pixel electrode is electrically connected to the second portion of the drain electrode through the third via.

In some embodiments, the array substrate further comprises a planarizing layer located on the passivation layer. The planarizing layer is provided with a plurality of fourth vias, an orthographic projection of each of the fourth vias onto the base substrate completely covering an orthographic projection of a respective one of the third vias onto the base substrate. Each of the pixel electrodes comprises a first portion located in the respective third via, a second portion located in a respective one of the fourth vias, and a third portion located on the planarizing layer.

In some embodiments, the orthographic projection of each of the fourth vias onto the base substrate further completely covers an orthographic projection of a respective one of the second vias onto the base substrate.

In some embodiments, the orthographic projection of each of the fourth vias onto the base substrate has a shape selected from a group consisting of a circle and a square.

In some embodiments, a geometric center of the orthographic projection of each of the fourth vias onto the base substrate overlaps a geometric center of the orthographic projection of the respective third via onto the base substrate.

In some embodiments, the planarizing layer has a thickness of 1 to 4 μm.

In some embodiments, an orthographic projection of the third via onto the base substrate surrounds an orthographic projection of the second via onto the base substrate.

In some embodiments, the orthographic projection of the third via onto the base substrate has an annular shape.

In some embodiments, a geometric center of the orthographic projection of the third via onto the base substrate overlaps a geometric center of the orthographic projection of the second via onto the base substrate.

In some embodiments, the orthographic projection of the third via onto the base substrate partially overlaps the orthographic projection of the second via onto the base substrate.

In some embodiments, the array substrate further comprises: a pixel defining layer located on the plurality of pixel electrodes and provided with a plurality of openings, each of the plurality of openings extending through the pixel defining layer to expose a region of a respective one of the plurality of pixel electrodes; a plurality of organic light emitting layers, each located in a respective one of the openings and covering the exposed region of the respective pixel electrode; and a complementary pixel electrode covering the plurality of organic light emitting layers and the pixel defining layer.

In some embodiments, the pixel defining layer has a thickness of 1 to 3 μm.

In some embodiments, the second via is tapered toward the base substrate.

In some embodiments, the second via has a minimum aperture that is greater than three times a depth of the second via.

In some embodiments, the array substrate further comprises a gate insulating layer sandwiched between the gate electrodes and the active layers.

In some embodiments, in each of the plurality of thin film transistors, the gate electrode is located farther from the base substrate than the active layer.

In some embodiments, in each of the plurality of thin film transistors, the gate electrode is located closer to the base substrate than the active layer.

According to another aspect of the present disclosure, a display panel is provided comprising the array substrate as described above.

According to yet another aspect of the present disclosure, a display device is provided comprising the display panel as described above.

These and other aspects of the present disclosure will be apparent from and elucidated with reference to the embodiment(s) described hereinafter.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

Figure 1:
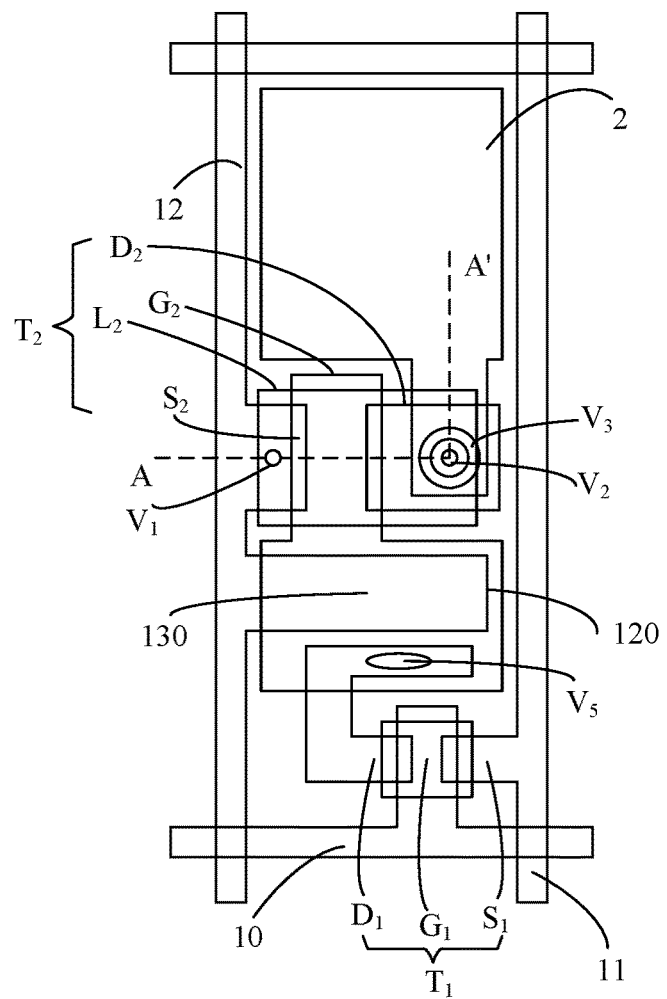
FIG. 1 is a schematic top plan view of a partial region of an array substrate in accordance with an embodiment of the present disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light extends through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the drawings.

FIG. 1 is a schematic top plan view of a partial region of an array substrate including an exemplary pixel unit in accordance with an embodiment of the present disclosure. It will be understood that although only a single pixel region is shown in FIG. 1 for convenience of illustration, the array substrate includes a plurality of such pixel regions arranged in an array.

Referring to FIG. 1, in the pixel region shown, a gate line 10 extends in a row direction, a data line 11 extends in a column direction, intersecting the gate line 10, and a power supply line 12 extends in parallel with the data line 11. The power line 12 includes a first electrode 120 that extends perpendicular to its length. A thin film transistor $T_1$ is disposed at the intersection of the gate line 10 and the data line 11, and includes a gate electrode $G_1$ connected to the gate line 10, a source electrode $S_1$ connected to the data line 11, and a drain electrode $D_1$ electrically connected to of a gate electrode $G_2$ of another thin film transistor $T_2$ through a fifth via $V_5$ that extends through an interlayer insulating layer 4 and a gate insulating layer 3. The gate electrode $G_2$ of the thin film transistor $T_2$ includes an extended portion forming a second electrode 130, wherein the second electrode 130 is disposed opposite to a first electrode 120 to form a storage capacitor. The thin film transistor $T_2$ further includes an active layer $L_2$, a drain electrode $D_2$ electrically connected to the active layer $L_2$ through a second via $V_2$, and a source electrode $S_2$ connected to the power supply line 12. The drain electrode $D_2$ is further electrically connected to a pixel electrode 2 through a third via $V_3$.

Figure 2:
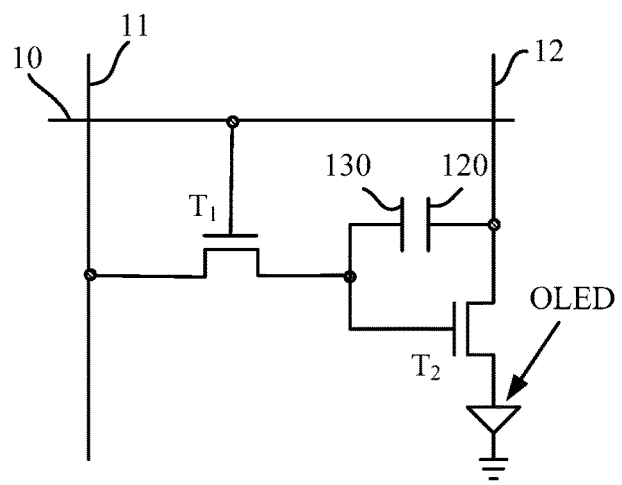
FIG. 2 is a circuit schematic diagram of a partial region of the array substrate of FIG. 1.

FIG. 2 shows an equivalent circuit of the pixel region of FIG. 1, which is a pixel circuit including an organic light emitting diode (OLED). In this example, the pixel electrode 2 in FIG. 1 may be, for example, an anode electrode of the OLED. It will be understood that the pixel circuit of FIG. 2 is merely exemplary and that other embodiments are possible. It will also be understood that the concepts of the present disclosure are not limited to OLED array substrates, but may also be applied to liquid crystal display (LCD) array substrates.

Referring back to FIG. 1, the thin film transistors $T_1$ and $T_2$ may be amorphous silicon TFTs, polysilicon TFTs, or oxide semiconductor TFTs. In the thin film transistor $T_1$, the gate electrode $G_1$ may also be a part of the gate line 10 (i.e., there is no separate gate pattern extending from the gate line 10), and the source electrode $S_1$ may also be a part of the data line 11 (i.e., there is no separate source electrode pattern extending from the data line 11). Embodiments of the present disclosure are not limited to TFTs of a particular kind and/or structure. By way of example and not limitation, the gate line 10, the gate electrodes $G_1$ and $G_2$, the power supply line 12, the source electrodes $S_1$ and $S_2$, the drain electrodes $D_1$ and $D_2$, and the data line 11 may be made of a metal material such as Cu (copper), Al (aluminum), Mo (molybdenum), Ti (titanium), Cr (chromium), and W (tungsten) or an alloy thereof. In addition, they may be a single layer structure or a multilayer structure, such as a stacked structure of Mo\Al\Mo, Ti\Cu\Ti, and Mo\Ti\Cu.

Figure 3:
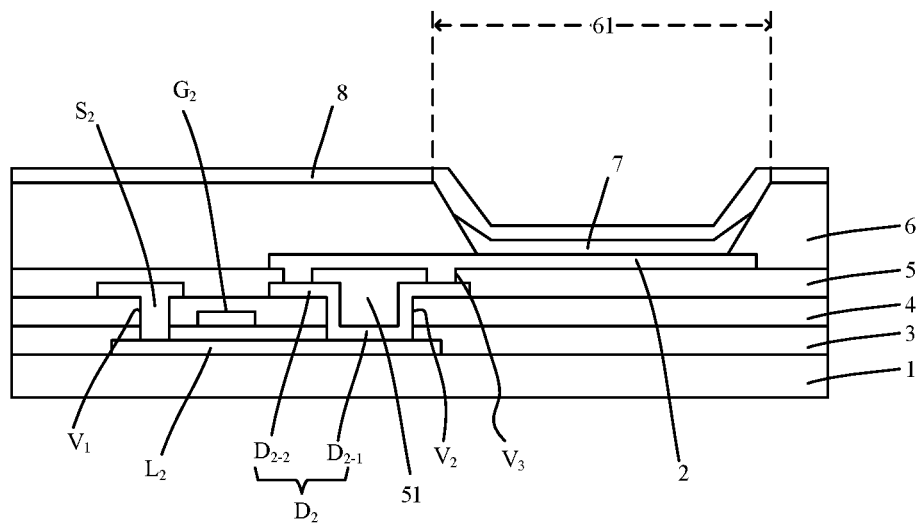
FIG. 3 is a schematic cross-sectional view taken along line A-A' of FIG. 1, illustrating an exemplary structure of a partial region of the array substrate of FIG. 1.

FIG. 3 is a schematic cross-sectional view taken along line A-A' of FIG. 1, illustrating an exemplary structure of a partial region of the array substrate of FIG. 1.

As shown in FIG. 3, the array substrate includes a base substrate 1 on which the active layer $L_2$ of the thin film transistor $T_2$ and the gate insulating layer 3 are disposed. The gate insulating layer 3 is sandwiched between the gate electrode $G_2$ of the thin film transistor $T_2$ and the active layer $L_2$. The active layer $L_2$ and the gate electrode $G_2$ are stacked on top of each other. In the example of FIG. 3, the thin film transistor $T_2$ is a top gate type transistor in which the gate electrode $G_2$ is located farther from the base substrate 1 than the active layer $L_2$. Specifically, the gate insulating layer 3 covers the active layer $L_2$, and the gate electrode $G_2$ is located on the gate insulating layer 3. The interlayer insulating layer 4 is disposed on the gate electrode $G_2$. The source electrode $S_2$ and the drain electrode $D_2$ of the thin film transistor $T_2$ are located on the interlayer insulating layer 4. The source electrode $S_2$ is electrically connected to the active layer $L_2$ through the first via $V_1$ extending through the interlayer insulating layer 4 and the gate insulating layer 3, and the drain electrode $D_2$ is electrically connected to the active layer $L_2$ through the second via $V_2$ that extends through the interlayer insulating layer 4 and the gate insulating layer 3. The drain electrode $D_2$ includes a first portion $D_{2-1}$ located in the second via $V_2$ and a second portion $D_{2-2}$ located outside the second via $V_2$. A passivation layer 5 is disposed on the source electrode $S_2$ and the drain electrode $D_2$. The passivation layer 5 includes a portion 51 covering the first portion $D_{2-1}$ of the drain electrode $D_2$. In this example, the portion 51 of the passivation layer 5 is directly on the first portion $D_{2-1}$ of the drain electrode $D_2$. The pixel electrode 2 is located on the passivation layer 5, and is electrically connected to the drain electrode $D_2$ through the third via $V_3$ that extends through the passivation layer 5.

In this embodiment, the array substrate further includes a pixel defining layer 6 disposed on the pixel electrode 2. The pixel defining layer 6 is provided with an opening 61 extending through the pixel defining layer 6 to expose a region of the pixel electrode 2. An organic light-emitting layer 7 is disposed inside the opening 61 and covers the exposed region of the pixel electrode 2. The array substrate further includes a complementary pixel electrode 8 covering the organic light-emitting layer 7 and the pixel defining layer 6. The complementary pixel electrode 8, the organic light-emitting layer 7, and the pixel electrode 2 form an OLED device. For example, the pixel electrode 2 is the anode of the OLED device and the complementary pixel electrode 8 is the cathode of the OLED device. In some examples, the pixel defining layer 6 may have a thickness of, for example, 1 to 3 This allows the organic light-emitting layer 7 to be provided with a deposition space having a sufficient depth.

The pixel defining layer 6 is generally prepared from an organic resin material. During the luminescence of the OLED device, residual gases in the resin material may escape from the pixel defining layer 6 due to heat generated by the luminescence.

In the absence of the passivation layer 5 (particularly the portion 51 of the passivation layer), the gas escaping from the pixel defining layer 6 may pass through a via structure between the pixel electrode 2 and the active layer $L_2$ (e.g., the second via $V_2$ and the third via $V_3$) and penetrate into the active layer $L_2$. This will affect the stability of the active layer and change the electrical characteristics of the thin film transistor $T_2$.

In contrast, due to the presence of the passivation layer 5 (particularly the portion 51 of the passivation layer 5) between the pixel defining layer 6 and the active layer $L_2$, the gas penetration to the active layer $L_2$ can be blocked, thereby improving the electrical stability of thin film transistor $T_2$. As mentioned earlier, this concept is equally applicable to LCD array substrates. Further, other insulating layers (e.g., the gate insulating layer 3 and the interlayer insulating layer 4) may also function to block the gas penetration to the active layer L2.

The orthographic projection of the third via $V_3$ onto the base substrate 1 may not overlap with the orthographic projection of the second via $V_2$ onto the base substrate 1. Given the fact that the pixel electrode 2 is electrically connected to the second portion $D_{2-2}$ of the drain electrode $D_2$ through the third via $V_3$ (i.e., a portion of the pixel electrode 2 is deposited in the third via $V_3$ and is in direct contact with the second portion $D_{2-2}$ of the drain electrode $D_2$), in the example shown in FIGS. 1 and 3, the orthographic projection of the third via $V_3$ onto the base substrate 1 surrounds the orthographic projection of the second via $V_2$ on the substrate 1, thereby providing a large contact area between the pixel electrode 2 and the second portion $D_{2-2}$ of the drain electrode $D_2$. This can facilitate the reliability of the electrical contact. In particular, in the example of FIG. 3, the orthographic projection of the third via $V_3$ onto the base substrate 1 is annular.

In this embodiment, the geometric center of the orthographic projection of the third via $V_3$ onto the base substrate 1 overlaps with the geometric center of the orthographic projection of the second via $V_2$ onto the base substrate 1. In the example of FIG. 3, since the orthographic projection of the third via $V_3$ onto the base substrate 1 is annular, the geometric center (or shape center) of the orthographic projection is the center of the two circles forming the annular shape (the centers of the two circles coinciding with each other).

Figure 4:
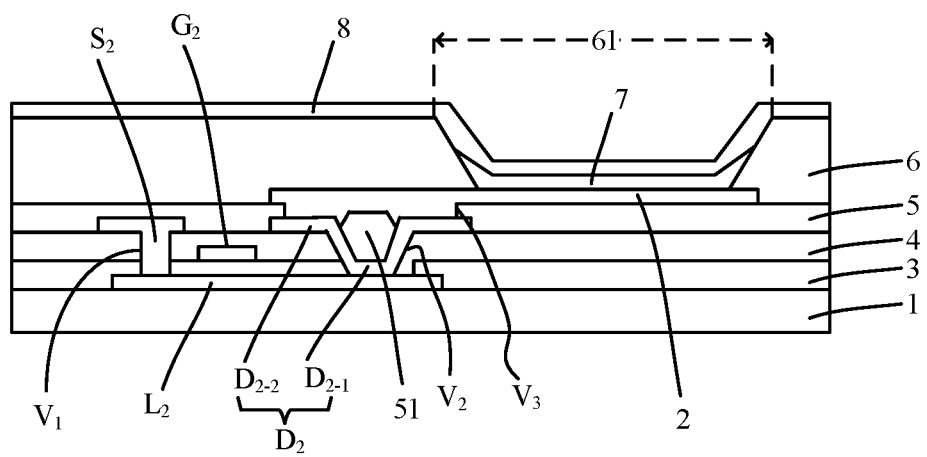
FIG. 4 is a schematic cross-sectional view taken along line A-A' of FIG. 1, illustrating another exemplary structure of a partial region of the array substrate of FIG. 1.

FIG. 4 is a schematic cross-sectional view taken along line A-A' of FIG. 1, illustrating another exemplary structure of a partial region of the array substrate of FIG. 1. The same reference signs as in FIG. 3 denote the same elements.

As shown in FIG. 4, the orthographic projection of the third via $V_3$ onto the base substrate 1 overlaps with the orthographic projection of the second via $V_2$ onto the base substrate 1. Specifically, the orthographic projection of the third via $V_3$ onto the base substrate 1 may completely cover the orthographic projection of the second via $V_2$ onto the base substrate 1. This allows an increase in the contact area between the pixel electrode 2 and the second portion $D_{2-2}$ of the drain electrode $D_2$, thereby improving the reliability of the electrical contact.

In this embodiment, the second via $V_2$ is tapered toward the base substrate 1. That is, the aperture of the second via $V_2$ gradually becomes smaller from top to bottom. In some examples, the minimum aperture of the second via $V_2$ is greater than three times the depth of the second via $V_2$ such that the drain electrode metal, when deposited at the second via $V_2$, can follow the shape of the second via $V_2$ to form a recessed portion. Thus, the portion 51 of the passivation layer 5 that covers the drain electrode $D_2$ can be formed on the recessed portion of the drain electrode $D_2$ in the second via $V_2$, providing a better blocking effect against the gas permeation to the active layer $L_2$.

Figure 5:
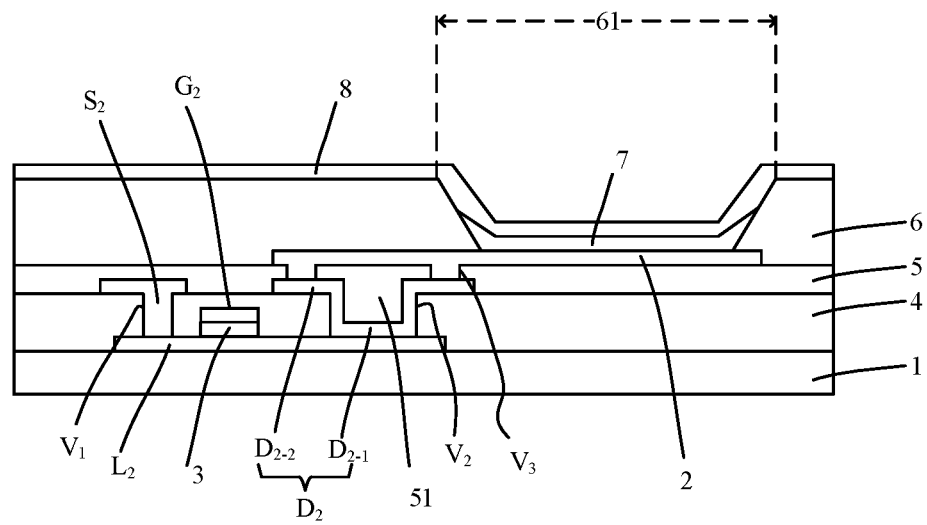
FIG. 5 is a schematic cross-sectional view taken along line A-A' of FIG. 1, illustrating yet another exemplary structure of a partial region of the array substrate of FIG. 1.

FIG. 5 is a schematic cross-sectional view taken along line A-A' of FIG. 1, illustrating still another exemplary structure of a partial region of the array substrate of FIG. 1. The same reference signs as in FIG. 3 denote the same elements.

Unlike the embodiments described above with respect to FIGS. 3 and 4, in the embodiment of FIG. 5, the gate insulating layer 3 is only located in the region of the active layer $L_2$ that corresponds to the gate electrode $G_2$, that is, the gate insulating layer 3 is located only below the gate electrode $G_2$. In this case, as shown in FIG. 5, the source electrode $S_2$ is connected to the active layer $L_2$ through the first via $V_1$ extending through the interlayer insulating layer 4, and the drain electrode $D_2$ is connected to the active layer L2 through the second via $V_2$ that extends through the interlayer insulating layer 4.

Other configurations of the array substrate are similar to the embodiment described above with respect to FIG. 3 and will not be described again herein.

Figure 6:
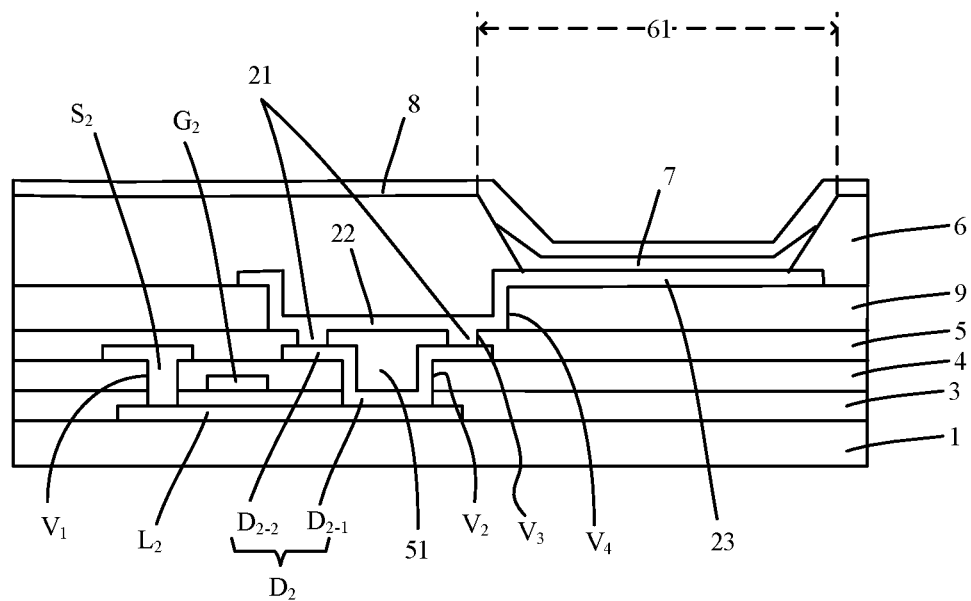
FIG. 6 is a schematic cross-sectional view taken along line A-A' of FIG. 1, illustrating yet still another exemplary structure of a partial region of the array substrate of FIG. 1.

FIG. 6 is a schematic cross-sectional view taken along line A-A' of FIG. 1 illustrating yet another exemplary structure of a partial region of the array substrate of FIG. 1. The same reference signs as in FIG. 3 denote the same elements.

As shown in FIG. 6, the array substrate further includes a planarizing layer 9 (having a thickness of, for example, 1 to 4 μm) provided on the passivation layer 5. The planarizing layer 9 is provided with a fourth via $V_4$ corresponding to the third via $V_3$. Here, the fourth via $V_4$ corresponding to the third via $V_3$ means that the fourth via $V_4$ can expose the below third via $V_3$ after the fourth via $V_4$ is formed in the planarizing layer 9 and the pixel electrode 2 is not yet deposited.

The pixel electrode 2 is disposed on the planarizing layer 9. The pixel electrode 2 includes a first portion 21 located in the third via $V_2$, a second portion 22 located in the fourth via $V_4$, and a third portion 23 located on the planarizing layer 9. The first portion 21 of the pixel electrode 2 is in direct electrical contact with the drain electrode second portion $D_{2-2}$. Since a portion of the pixel electrode 2 is deposited in the third via $V_3$ and the fourth via $V_4$, a reliable connection between the first portion 21 of the pixel electrode 2 and the second portion $D_{2-2}$ of the drain electrode $D_2$ can be achieved.

The pixel defining layer 6 is disposed above the pixel electrode 2. The pixel defining layer 6 is provided with a plurality of openings 61 (only one of them is shown in FIG. 6). Each of the plurality of openings 61 extends through the pixel defining layer 6 to expose a region of a respective pixel electrode 2. In the pixel region shown in FIG. 6, the organic light-emitting layer 7 is disposed inside the opening 61 to cover the exposed region of the pixel electrode 2, and the complementary pixel electrode 8 is provided to cover the organic light-emitting layer 7 and the pixel defining layer 6. The complementary pixel electrode 8, the organic light-emitting layer 7, and the pixel electrode 2 form an OLED device.

In the example of FIG. 6, the orthographic projection of the fourth via $V_4$ onto the base substrate 1 completely covers the orthographic projection of the third via $V_3$ onto the base substrate 1. Further, the orthographic projection of the fourth via $V_4$ onto the base substrate 1 completely covers the orthographic projection of the second via $V_2$ onto the base substrate 1. The area of the fourth via V4 is large, providing a good electrical connection between the pixel electrode 2 and the drain electrode $D_2$. Here, the orthographic projection of the fourth via $V_4$ onto the base substrate 1 may be circular or square. Moreover, the geometric center of the orthographic projection of the fourth via $V_4$ onto the base substrate 1 overlaps with the geometric center of the orthographic projection of the third via $V_3$ onto the base substrate 1.

In the embodiments described above, each of the gate insulating layer 3, the interlayer insulating layer 4, and the passivation layer 5 may be made of a silicon nitride or silicon oxide material. Each of them may be a single layer structure or a multilayer structure such as silicon oxide and silicon nitride in a stacked design. The planarizing layer 9 can be fabricated using an organic resin material. The pixel electrode 2 can be fabricated by using transparent metal oxide conductive materials such as ITO (Indium Tin Oxide), IZO (Indium Zinc Oxide), and FTO (Fluorine-Doped Tin Oxide). In embodiments where the pixel electrode 2 is specifically an anode of the OLED device, the pixel electrode 2 can be fabricated using a transparent metal oxide conductive material. Alternatively, the pixel electrode 2 may also adopt a stacked structure of a transparent metal oxide conductive material and a metal material such as silver (Ag). For example, the pixel electrode 2 may be a three-layer structure of ITO\Ag\ITO. The complementary pixel electrode 8 may be made of a metal material such as aluminum (Al) and/or silver (Ag), and may be a single layer or a stacked structure. Other embodiments are also contemplated.

It will be understood that although the thin film transistors are shown and described as a top gate transistor in the above embodiments, each of them may be a bottom gate transistor in which the gate electrode is located closer to base substrate 1 than the active layer $L_2$.

Figure 7:
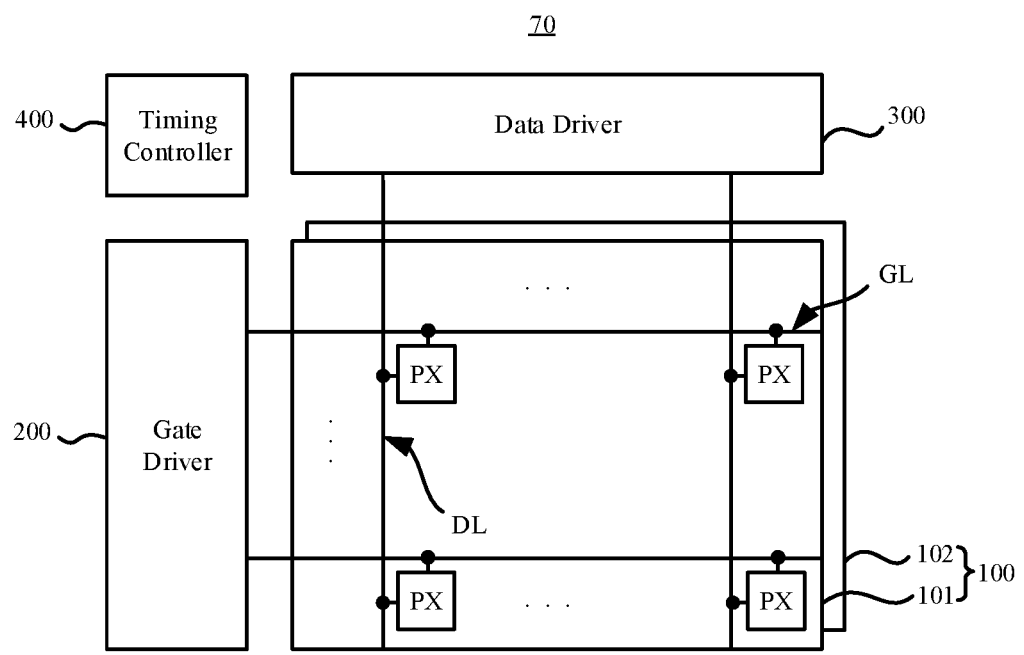
FIG. 7 is a schematic diagram of a display device in accordance with an embodiment of the present disclosure.

FIG. 7 is a block diagram showing a display device 70 in accordance with an embodiment of the present disclosure. By way of example and not limitation, the display device 70 can be any product or component having a display function, such as a cell phone, a tablet, a television, a monitor, a notebook computer, a digital photo frame, a navigator, and the like.

Referring to FIG. 7, the display device 70 includes a display panel 100 for displaying images, a gate driver 200 for outputting gate scan signals to the display panel 100, a data driver 300 for outputting data voltages to the display panel 100, and a timing controller 400 for controlling the gate driver 200 and the data driver 300.

The display panel 100 includes an array substrate 101 and a counter substrate 102 opposite to the array substrate 101. In the case of a liquid crystal display device, the display panel 100 further includes a liquid crystal layer (not shown) sandwiched between the array substrate 101 and the counter substrate 102, and the counter substrate 102 may be a color filter substrate. In the case of an organic light emitting diode display device, the counter substrate 102 may be a cover plate.

The array substrate 101 includes a plurality of pixel regions PX arranged in an array. Each of the pixel regions PX is located at a respective intersection of the plurality of gate lines GL and the plurality of data lines DL. Each pixel region includes a pixel that includes a thin film transistor (not shown) and other associated components.

The gate driver 200 is electrically connected to first ends of the respective gate lines GL, thereby sequentially applying gate scan signals to the respective gate lines GL. In some exemplary embodiments, the gate driver 200 may be directly mounted (e.g., integrated) in the array substrate 101. Alternatively, the gate driver 200 may be connected to the display panel 100 through a Tape Carrier Package (TCP).

The data driver 300 is electrically connected to first ends of the respective data lines DL to output data voltages to the respective data lines DL. In some embodiments, data driver 300 can include a plurality of data driving chips operating in parallel.

The timing controller 400 controls the operation of each of the gate driver 200 and the data driver 300. Specifically, the timing controller 400 outputs data control signals and image data to control a driving operation of the data driver 300, and outputs gate control signals to control a driving operation of the gate driver 200. The data control signals and the image data are applied to the data driver 300. The gate control signals are applied to the gate driver 200.

Although the present disclosure has been illustrated and described in detail in the drawings and the foregoing description, such illustration and description should be regarded as illustrative and exemplary, rather than restrictive. The present disclosure is not limited to the embodiments disclosed. Variations to the disclosed embodiments can be understood and effected by those skilled in practicing the claimed subject matter, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that the measures cannot be used to advantage.

What is claimed is:

1. An array substrate, comprising:
a base substrate comprising a plurality of pixel regions arranged in an array;
a plurality of thin film transistors corresponding to respective ones of the plurality of pixel regions, each of the thin film transistors comprising:
an active layer on the substrate;
a gate electrode on the base substrate, wherein the active layer and the gate electrode are stacked on top of each other;
a source electrode above the gate electrode, wherein the source electrode is electrically connected to the active layer through a first via; and
a drain electrode above the gate electrode, wherein the drain electrode is electrically connected to the active layer through a second via, and wherein the drain electrode comprises a first portion in the second via and a second portion outside the second via;
a passivation layer on the source electrode and the drain electrode of each of the thin film transistors, wherein the passivation layer is on the first portion of the drain electrode of each of the thin film transistors;
a plurality of pixel electrodes associated with respective ones of the plurality of pixel regions; and
a planarizing layer on the passivation layer,
wherein the plurality of pixel electrodes are on the passivation layer,
wherein each of the pixel electrodes are electrically connected to the drain electrode of a respective one of the thin film transistors through a respective third via of a respective one of the thin film transistors that extends through the passivation layer,
wherein a respective one of the plurality of pixel electrodes is electrically connected to the second portion of the drain electrode through the respective third via of the respective one of the thin film transistors,
wherein the planarizing layer is associated with a plurality of fourth vias,
wherein an orthographic projection of each of the plurality of fourth vias onto the base substrate completely covers an orthographic projection of the respective third via of the respective one of the thin film transistors onto the base substrate, and
wherein each of the pixel electrodes comprises a third portion in the respective third via, a fourth portion in a respective one of the plurality of fourth vias, and a fifth portion on the planarizing layer.

2. The array substrate of claim 1, wherein the orthographic projection of each of the plurality of fourth vias onto the base substrate further completely covers an orthographic projection of a respective one of the second vias onto the base substrate.

3. The array substrate of claim 2, wherein the orthographic projection of each of the plurality of fourth vias onto the base substrate has a shape selected from a group comprising a circle and a square.

4. The array substrate of claim 1, wherein a geometric center of the orthographic projection of each of the plurality of fourth vias onto the base substrate overlaps a geometric center of the orthographic projection of the respective third via onto the base substrate.

5. The array substrate of claim 1, wherein the planarizing layer has a thickness of 1 to 4 μm.

6. The array substrate of claim 1, wherein an orthographic projection of the respective third via onto the base substrate surrounds an orthographic projection of the second via of the respective one of the thin film transistors onto the base substrate.

7. The array substrate of claim 6, wherein the orthographic projection of the respective third via onto the base substrate has an annular shape.

8. The array substrate of claim 6, wherein a geometric center of the orthographic projection of the respective third via onto the base substrate overlaps a geometric center of the orthographic projection of the second via of the respective one of the thin film transistors onto the base substrate.

9. The array substrate of claim 6, wherein the orthographic projection of the respective third via onto the base substrate partially overlaps the orthographic projection of the second via of the respective one of the thin film transistors onto the base substrate.

10. The array substrate of claim 1, further comprising:
a pixel defining layer on the plurality of pixel electrodes and comprising a plurality of openings, wherein each of the plurality of openings extends through the pixel defining layer to expose a region of a respective one of the plurality of pixel electrodes;
a plurality of organic light emitting layers that are in respective ones of the plurality of openings and on the region that is exposed of the respective one of the plurality of pixel electrodes; and
a complementary pixel electrode on the plurality of organic light emitting layers and the pixel defining layer.

11. The array substrate of claim 10, wherein the pixel defining layer has a thickness of 1 to 3 μm.

12. The array substrate of claim 1, wherein the second via is tapered toward the base substrate.

13. The array substrate of claim 12, wherein the second via has a minimum aperture that is greater than three times a depth of the second via.

14. The array substrate of claim 1, further comprising:
a gate insulating layer between the gate electrode and the active layer of each of the plurality of thin film transistors.

15. The array substrate of claim 14, wherein in each of the plurality of thin film transistors, the gate electrode is farther from the base substrate than the active layer.

16. The array substrate of claim 14, wherein in each of the plurality of thin film transistors, the gate electrode is closer to the base substrate than the active layer.

17. A display panel comprising the array substrate of claim 1.

18. A display device comprising the display panel of claim 17.

\* \* \* \* \*